US007644250B2

(12) United States Patent
Zimmerman et al.

(10) Patent No.: US 7,644,250 B2

(45) Date of Patent: Jan. 5, 2010

(54) DEFINING PIN FUNCTIONALITY AT DEVICE POWER ON

(75) Inventors: David J. Zimmerman, El Dorado Hills, CA (US); Jun Shi, San Jose, CA (US); Aaron Martin, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 11/480,137

(22) Filed: Jun. 30, 2006

(65) Prior Publication Data

US 2008/0002336 A1 Jan. 3, 2008

(51) Int. Cl.
*G06F 12/00* (2006.01)

(52) U.S. Cl. ....................... 711/170; 711/100; 711/115; 711/171; 365/51; 365/63; 365/189.02; 365/189.03; 361/600; 361/728; 361/679; 361/683; 361/684; 361/731; 361/733; 361/736; 361/737; 361/748; 361/755; 361/760; 361/763; 361/754; 439/95; 439/101; 439/679; 439/639; 439/946

(58) Field of Classification Search ................. 711/100, 711/115; 365/63, 51, 189.02–189.03; 361/413, 361/760, 763, 754–786, 600.679, 683–684, 361/728, 731, 733, 736, 737, 748, 755; 439/679, 439/639, 946, 946.2, 95, 101

See application file for complete search history.

(56) References Cited

U.S. PATENT DOCUMENTS 6,183,307 B1 * 2/2001 Laity et al. .................. 439/676
6,233,157 B1 * 5/2001 Yoon et al. .................. 361/760
6,721,195 B2 * 4/2004 Brunelle et al. ............... 365/63
2002/0048986 A1 * 4/2002 Lewis et al. ................. 439/345
2005/0041449 A1 * 2/2005 Houston ........................ 365/1
2005/0094631 A1 * 5/2005 Park et al. ................... 370/378
2007/0153588 A1 * 7/2007 Janzen .................. 365/189.03
2007/0243769 A1 * 10/2007 Atsmon et al. .............. 439/660

* cited by examiner

*Primary Examiner*—Stephen C Elmore
*Assistant Examiner*—Zhuo H Li
(74) *Attorney, Agent, or Firm*—Blakely, Sokoloff, Taylor & Zafman LLP

(57) ABSTRACT

An orientation detector within a device package is used to establish the device orientation. A host controller coupled to the device supplies a control signal to at least one of the pins on the device during a setup phase. The pin that receives the control signal is used for active signaling during normal operations of the device. Based on the control signal, the orientation detector generates an orientation signal within the device. An analog or digital selector circuit connects the pins to correct internal circuit components according to the device orientation.

26 Claims, 7 Drawing Sheets

DEFINING PIN FUNCTIONALITY AT DEVICE POWER ON

BACKGROUND

1. Field

Microelectronic circuit design and packaging.

2. Background

Some microelectronic devices may be placed on opposite sides of a motherboard instead of being placed side by side. For example, two individually packaged memory chips are sometimes mounted back to back on a motherboard. One of the chips is mounted facing up on top of the board, and the other chip is mounted facing down on the bottom of the board. The stacked configuration is area efficient in that it increases device density on the motherboard and allows manufacturers of computers, cell phones, portable music players, and other microelectronics to create smaller devices. The stacked configuration may simplify signal routing because the devices may share the same signal conducting lines on the motherboard. To improve high speed signaling characteristics, it is desirable to route conducting signals directly through the motherboard. However, this requires devices with different package pin-outs or other accommodation as the bottom device pins will be a mirror image of the top device pins.

A stacked device generally has a "normal" configuration and a "rotated" configuration. For example, when two Dynamic Random Access Memory (DRAM) devices are stacked, one of the DRAMs is rotated such that outputs from one device align with inputs to the other device. Sometimes, devices may not align correctly when one of them is rotated. The mismatch can be resolved by duplicating pin functions such that pin layout is the same in normal and rotated orientations. However, pin duplication creates a large number of redundant pins and is therefore highly undesirable for cost sensitive devices.

Another technique is to create input/output (I/O) designs that are capable of operating in two orientations. A conventional approach is to use one or more dedicated pins to determine orientation and then assign pin functions accordingly. For example, if a dedicated pin is pulled high, the device senses one orientation; if the pin is low, the device assumes the other orientation. One disadvantage of this approach is that the design requires at least one additional pin, or more likely two duplicate pins for symmetry. A further disadvantage is that the dedicated pins cannot be used for active signaling or other useful purposes after the orientation has been established.

BRIEF DESCRIPTION OF THE DRAWINGS

Embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1B:
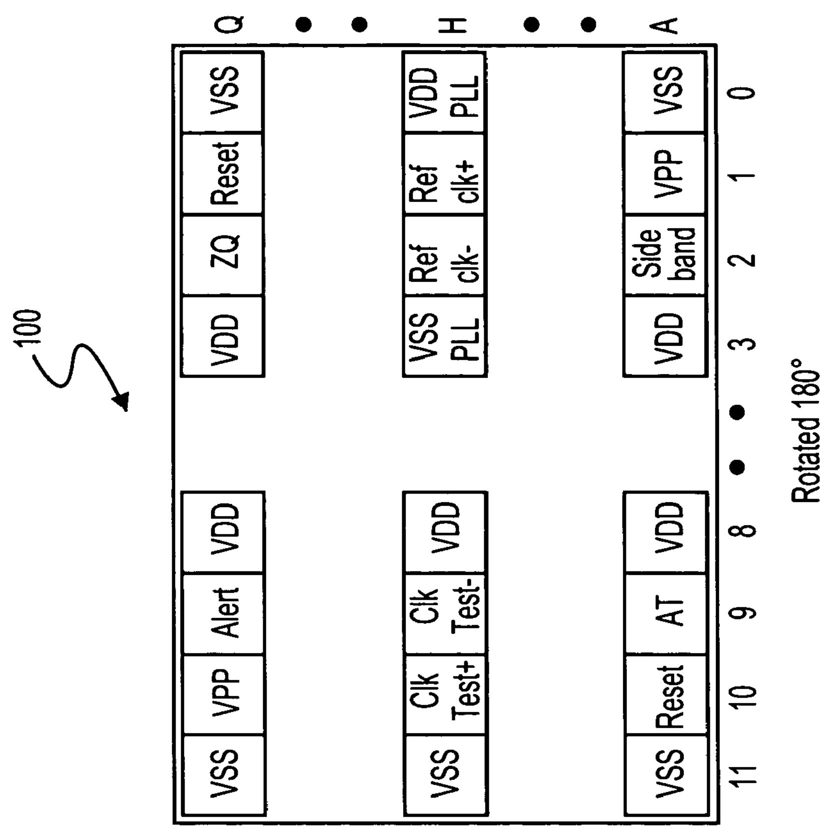
FIG. 1A, FIG. 1B, FIG. 1C, and FIG. 1D show examples of pin layout of a packaged device in a normal orientation, a rotated orientation, a flipped orientation, and a rotated and flipped rotation, respectively.
Figure 1A:
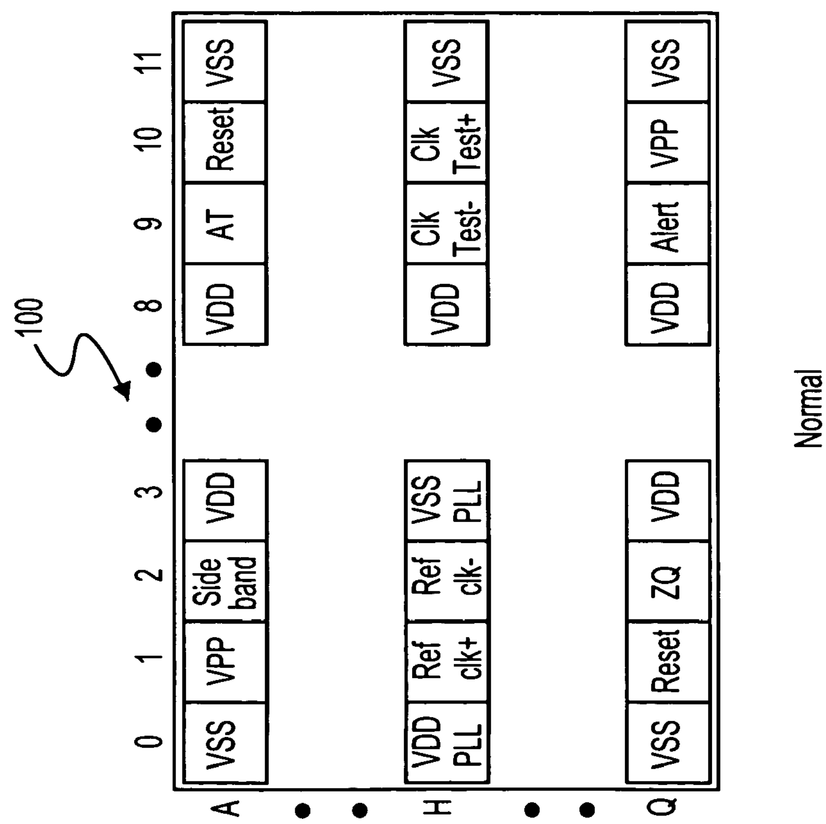
Figure 1D:
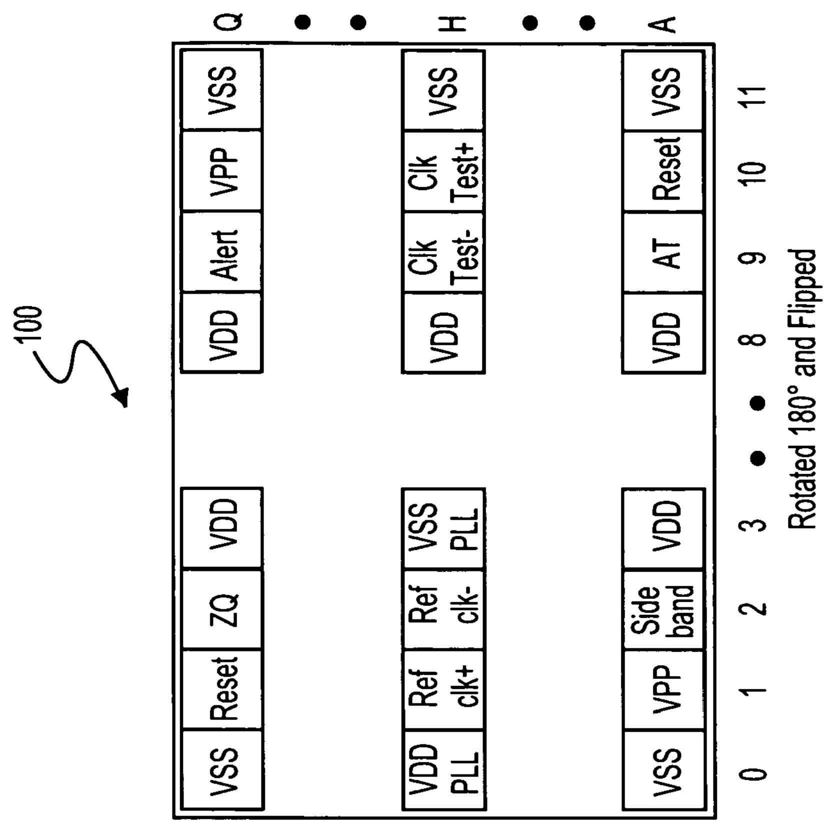
Figure 1C:
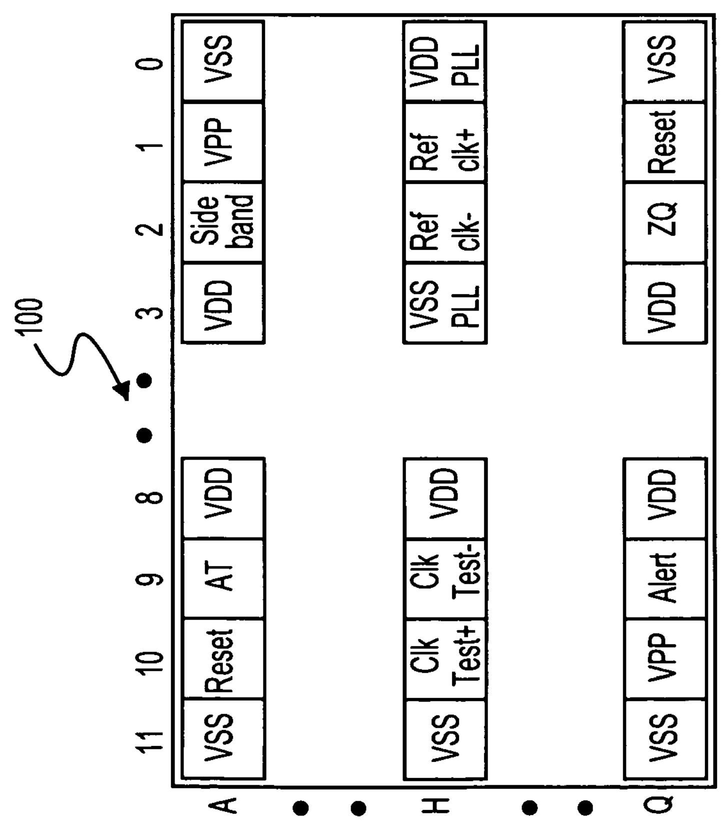

FIG. 1A, FIG. 1B, FIG. 1C, and FIG. 1D show four examples of pin layout on the backside of a packaged device 100. The term "packaged device", or equivalently, "device package" refers to an electronic component that include a chip and associated wiring and pins. The term "pin" used herein refers to any connections that go into the chip for carrying signals. The term "pin" is meant to include a physical pin, a ball, or any connection capable of conducting electrical signals. FIG. 1A shows device 100 in a normal orientation. FIG. 1B shows the same device rotated 180°, FIG. 1C shows the normal orientation flipped left to right, and FIG. 1D shows the rotated orientation flipped left to right. Generally, device 100 may be any type of device performing any functions. In one embodiment, device 100 may have a limited pin count such that it would not be feasible to dedicate one or more pins for device configuration (e.g., device orientation). For example, device 100 may be a microcontroller; alternatively, device 100 may be a memory device such as a dynamic random access memory (DRAM), a synchronous DRAM (SDRAM), a static RAM (SRAM), a flash memory, or any volatile or non-volatile memory devices.

Figure 2A:
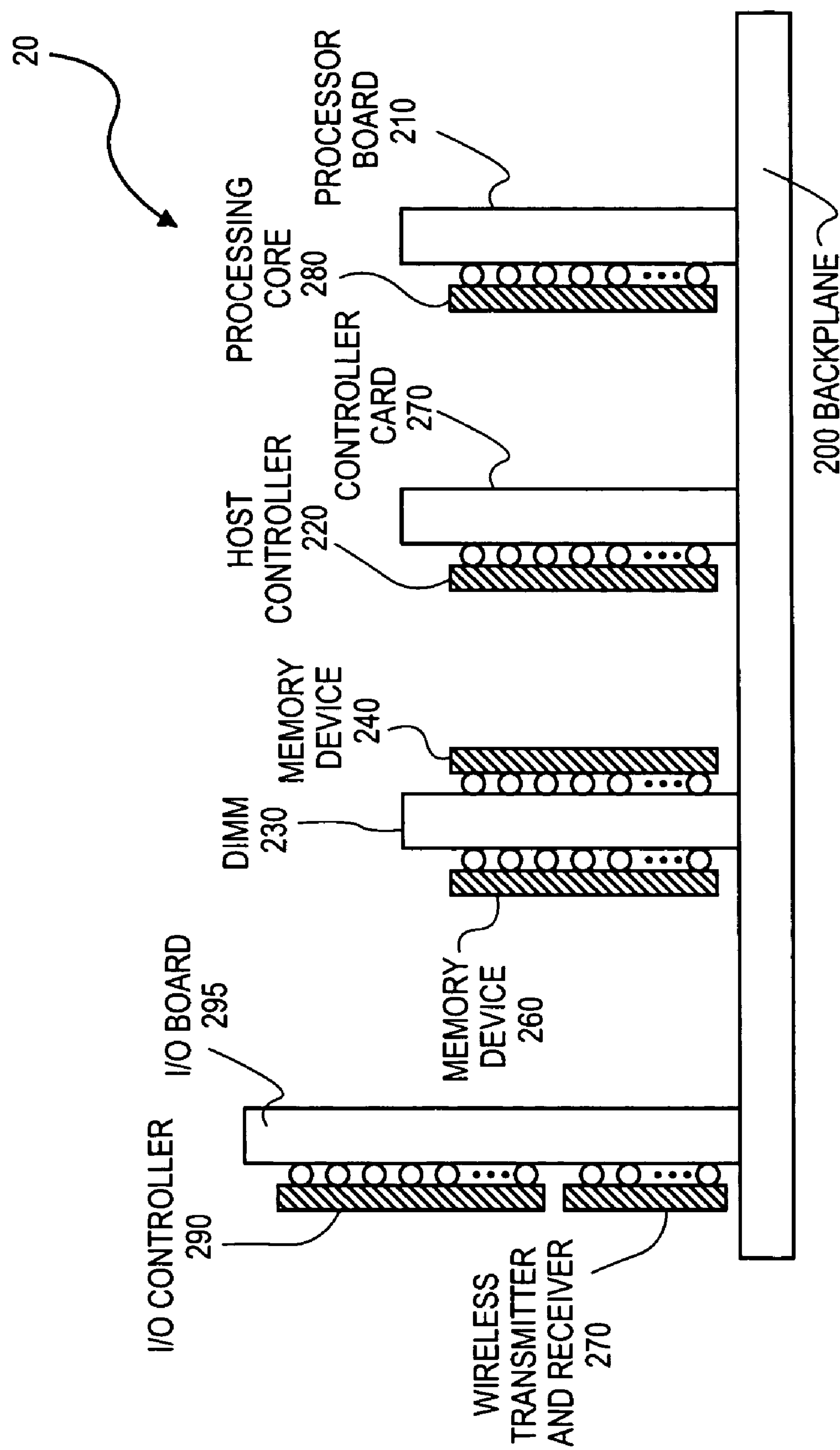
FIG. 2A is a side view of an embodiment of a backplane having a plugged-in memory module on which two back-to-back memory devices are mounted.

In one embodiment, packaged device 100 may be a memory device that is mounted on a memory module such as a dual in-line memory module (DIMM) or other suitable memory modules. For example, FIG. 2A shows a system 20 including a circuit board (e.g., a backplane 200) on which a plurality of plug-in modules are installed. The plurality of plug-in modules may include, but are not limited to, a processor board 210, a controller card 270, a memory module 230, and an input/output (I/O) board 295. Processor board 210 may include one or more processing cores 280. A host controller 220 may be mounted on controller card 270. Host controller 220 may alternatively be mounted on processor board 210 or be integrated into the same chip(s) as processing cores 280. Two or more memory devices 240 and 260 may be mounted back-to-back on opposite sides of memory module 230. It is understood that more than two memory devices may be mounted by using a die-stacking or package-stacking technology commonly used in the industry. I/O board 295 may include an I/O controller 290 coupled to host controller 220 to provide an interface to I/O devices, e.g., a wireless transmitter and receiver 270 or a wire-lined device. Backplane 200 includes a plurality of signal conducting lines (only two are shown) among the plug-in modules for exchanging signals among the modules.

In alternative embodiments, backplane 200 may be a motherboard that includes a plurality of connectors for receiving the plurality of plug-in modules. In this configuration, one or more of the devices described above may be directly mounted on the motherboard instead of mounting on the plug-in modules.

Memory devices 240 and 260 may be the same type of memory (e.g., two DRAM chips) or different types of memory (e.g., a DRAM chip and a SDRAM chip) having the same pin layout. Memory devices 240 and 260 may be mounted back-to-back such that one device is in the normal orientation and other is in the rotated 180° orientation. Alternatively, memory devices 240 and 260 may be mounted back-to-back such that one device is in the normal orientation and other is in the rotated 180° and flipped orientation. The pins on two memory devices 240 and 260 are aligned such that the pins having same functions are connected together through conducting lines on memory module 230. The alignment of the pins may increase signal routing efficiency in that memory devices 240 and 260 may share a single signal conducting line on memory module 230.

In FIG. 2A, system 20 may be a desktop/laptop computer, a server, or other suitable computing devices that include a plurality of memory devices. Mounting the memory devices as shown may save space and facilitate a compact design of system 20.

Figure 2B:
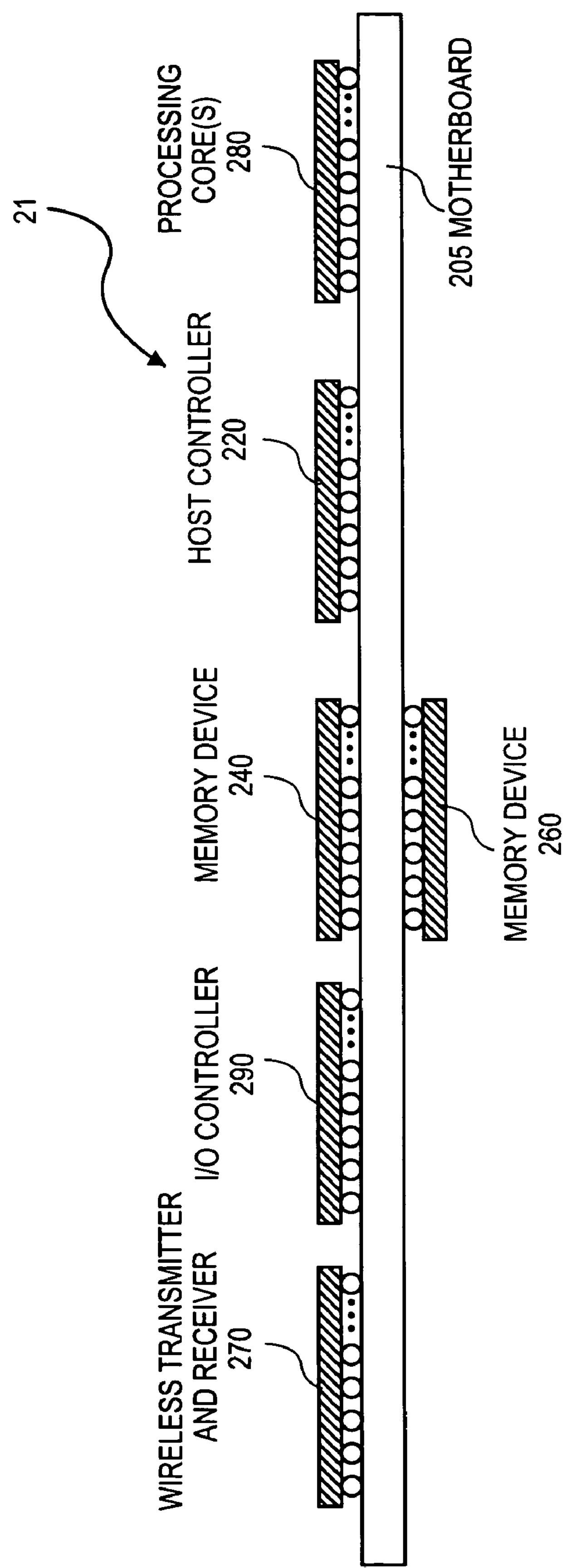
FIG. 2B is a side view of an embodiment of a motherboard including two memory devices mounted back-to-back on the motherboard.

FIG. 2B shows another embodiment of a system 21 including a motherboard 205, on which at least one processing core 280, host controller 220, memory devices 240 and 260, I/O controller 290, and I/O devices (e.g., wireless transmitter and receiver 270) are mounted. Memory devices 240 and 260 may be mounted back-to-back on opposite sides of motherboard 205 such that one memory device is in one orientation and the other is in a different orientation. Memory devices 240 and 260 may be the same type of memory devices or different types of memory devices having aligned pins. Processing cores 280 and host controller 220 may be implemented on separate chips as shown, or may be integrated into the same chip. Memory devices 240 and 260 may be mounted directly on motherboard 205 as shown or may be mounted on a module similar to that shown in DIMM 230 of FIG. 2A.

In FIG. 2B, system 21 may be a desktop/laptop computer, a server, a cellular phone, a personal digital assistant, a portable music player, or any other suitable wired or wireless system. Mounting memory devices 240 and 260 on motherboard 205 as shown may save space on the motherboard and facilitate a compact design of system 21.

Referring back to FIG. 1A and FIG. 1B, the pins of device 100 may be arranged as a plurality of rows (A, B, C, . . . , Q) and a plurality of columns (0, 1, 2, . . . , 10, 11). For simplicity of the illustration, only three rows and eight columns are shown. A pin on device 100 is referred to as a symmetric pin if the pin and its rotated counterpart have the same functionality. A symmetric pin and its rotated counterpart are, hereinafter, referred to as a pair of symmetric pins. For example, a number of power pins Vss (located at A11 and Q0), Vpp (located at A1 and Q10), and VDD (located at A3 and Q8) may be symmetric pins. Reset pins (located at A10 and Q1) may also be symmetric pins. Symmetric pins can be accessed from the same locations regardless of the device orientation. Thus, in one embodiment, each pair of symmetric pins may be shorted together inside the package so that the same signal is routed to both pins.

Device 100 may also include asymmetric pins. A pin is an asymmetric pin if the pin and its rotated counterpart have different functionality. An asymmetric pin and its rotated counterpart are, hereinafter, referred to as a pair of asymmetric pins. Examples of pairs of asymmetric pins include: Sideband (located at A2) and Alert (located at Q9), Ref clk+/− (located at H1 and H2), Clk Test+/− (located at H9 and H10), ZQ (located at Q2) and Analog Test (AT) (located at A9), and many other pins not shown. An asymmetric pin may be accessed in one location in the normal orientation but is accessed in a different location in the rotated orientation. Thus, device orientation needs to be established in order to correctly route signals through these asymmetric pins.

In one embodiment, an internal register bit may be used to establish the device orientation. Generally, setting the register bit appropriately requires establishing a reliable and orientation-independent communication mechanism between device 100 and an external chip, such as host controller 220 of FIG. 2A, or any other circuits connecting to device 100 and programmed to recognize the device orientation.

Figure 3A:
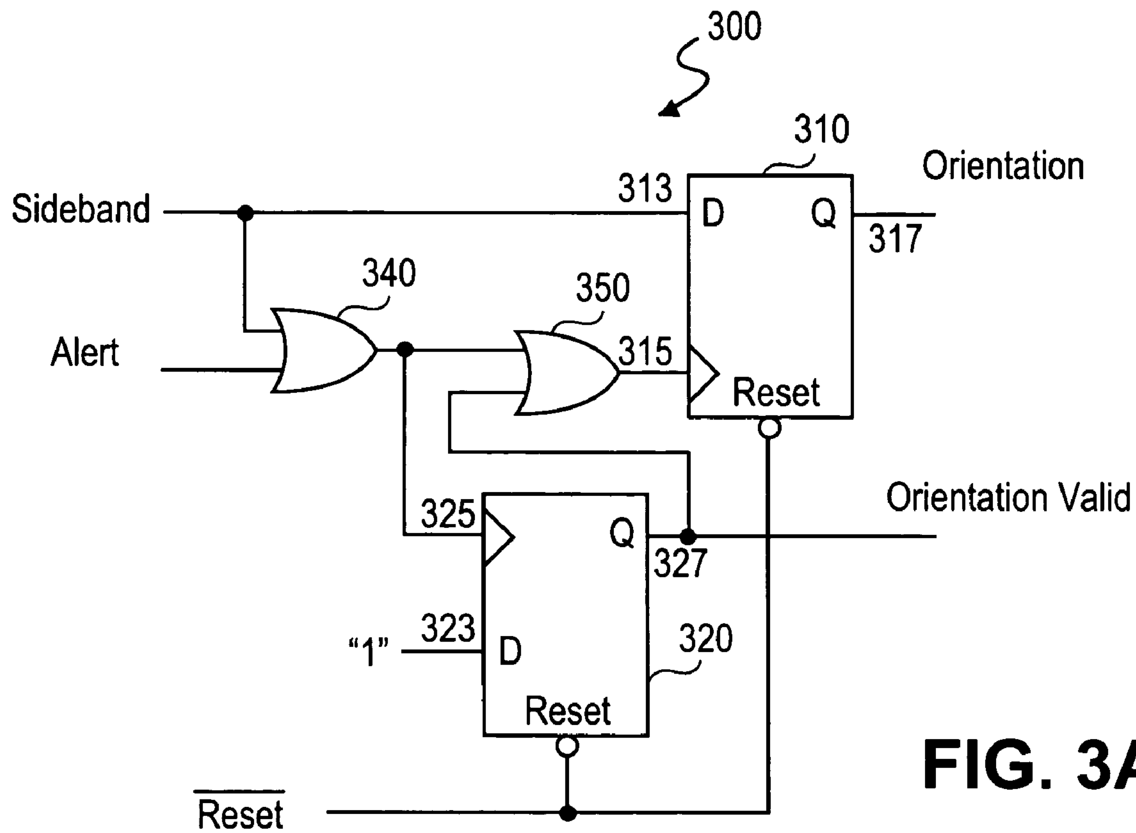
FIG. 3A and FIG. 3B show two examples of an orientation detector embedded in the packaged device.

Referring to FIG. 3A, in one embodiment, device 100 includes an orientation detector 300 to detect the orientation of the device. Orientation detector 300 may operate independently of any clock inputs. Orientation detector 300 may be connected to a pair of asymmetric pins to receive a control signal from a host controller (e.g., host controller 220 of FIG. 2A). In one embodiment, the pair of asymmetric pins may be the Sideband pin and the Alert pin. In alternative embodiments, one or more different asymmetric pins may be used, provided the pins are connected to host controller 220. Host controller 220 may pull one pin high and the other low, which in turn sets an orientation bit of an internal register. For example, an orientation bit of "1" may indicate a rotated orientation and an orientation bit of "0" bit may indicate a normal orientation. Once the register bit is set (or cleared), the register bit retains the same value until a reset signal is applied to orientation detector 300. Referring also to FIG. 1, in an embodiment host controller 220 may drive pin location A2 high and pin Q9 low. A device in the "normal" orientation would detect a high signal on the Sideband input and a low on the Alert input. A device in the "rotated" orientation would detect the opposite condition (Sideband low and Alert high). Therefore, a device may determine which way it is oriented by observing the states of pins A2 and Q9.

In the embodiment of FIG. 3A, orientation detector 300 may include a first register 310 and a second register 320. Registers 310 and 320 may be implemented by a pair of delay (DQ) flip-flops each having a data input (313, 323), a clock input (315, 325), and an output (317, 327). First register 310 receives an input from the Sideband pin. Second register 320 is wired to a constant "1" at its input 323. A first OR gate 340 receives inputs from the Sideband pin and the Alert pin, and generates an output to the input of a second OR gate 350 as well as clock input 325 of second register 320. Second OR gate 350 receives inputs from first OR gate 340 and output 327 of second register 320, and generates an output to clock input 315 of first register 310. Output 327 of second register 320 is an "orientation valid" bit, when set, indicating that the "orientation" bit at output 317 is valid. After orientation is detected, further changes in orientation are blocked. This allows the Sideband and Alert pins to be used for other functions. In one embodiment, Sideband may be used for access to internal DRAM registers and Alert may be used to signal error conditions.

Initially, during an orientation setup phase, both registers 310 and 320 may be reset to an initial state. After the reset, the "orientation valid" bit remains cleared until the first time the Sideband pin is asserted. The assertion of the Sideband pin sets the "orientation valid" bit, which in turn triggers register 310 to set its output 317, the orientation bit, to one. The orientation bit may be sent to other asymmetric pins so that they may use the orientation bit to configure their functionality during the orientation setup phase. The orientation bit retains its value regardless of subsequent signaling routed through either the Sideband pin or the Alert pin. The orientation bit may be cleared by a reset signal applied to both registers 310 and 320.

Figure 3B:
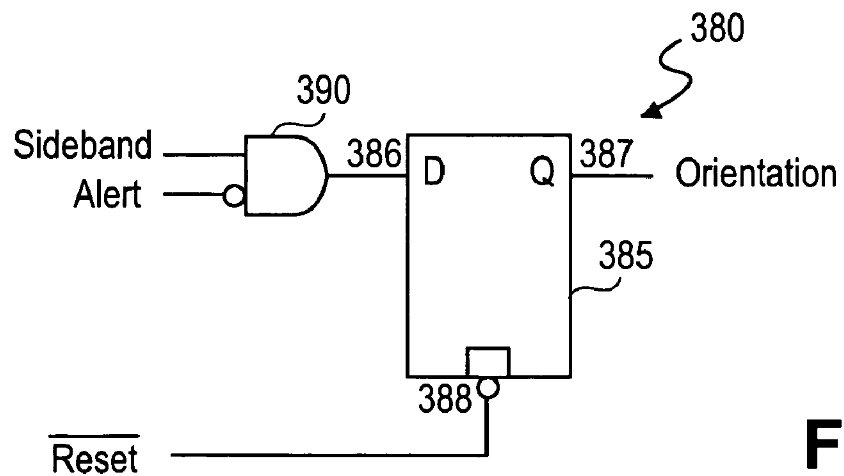

Referring to FIG. 3B, another embodiment of an orientation detector 380 is shown. Orientation detector 380 includes a register implemented by a latch 385 having an input 386, an output 387, and a reset input 388. Input 386 is connected to the output of an AND gate 390, which performs an "AND"

operation on the sideband signal and an inverted alert signal. Output 387 is the orientation bit indicating the device orientation. To set the orientation bit, host controller 220 may pull the Sideband pin high and the Alert pin low. Latch 385 is transparent while reset is asserted, allowing the value at input 386 to propagate to the orientation signal 387. When reset is deasserted the value at input 386 is latched and orientation signal 387 will retain whatever value was present on input 386 at that time. This implementation allows the orientation information to propagate to other pins, such as clock pins while reset is active.

In alternative embodiments, the above latch operation may be triggered by the assertion or deassertion of a signal other than the reset signal. That is, the control signal at input 386 may be transferred to the orientation signal when a signal other than the reset signal is asserted/deasserted. The signal may be internally generated on-die, or externally generated off-die. For example, latch 385 may be triggered by a power_good signal indicating power supply to the device is in a valid operating state. The power_good signal may be generated by a chipset component external to the device or internally generated on-die.

The orientation logic described above is not limited to selecting one of two possible orientations. For example, in FIG. 3B, the sideband and alert signals may be connected to one or more additional orientation detector circuits 380 to generate additional orientation bits. By changing the input logic of AND gate 390, it is possible to detect not only sideband high and alert low but other states as well. These states can be presented on one or more orientation bits to indicate more than two possible device orientations.

In other embodiments, additional pins may be incorporated into the input. For example, three pins could be used to establish one of several possible orientations or to establish a device ID or base addresses.

The orientation bit may be sent to every pair of asymmetric pins on the packaged device. In one embodiment, each pair of asymmetric pins may include a selector circuit that receives the orientation bit from orientation detector 300 or 380 to select pin functionality accordingly. The selector circuit may an analog circuit or a digital circuit. The selector circuit may also be used with input-only signals, output-only signals, or input and output signals.

In the scenarios where more than one orientation bit is generated, the orientation bits may be routed to a multiple-input selector circuit or to a combination of multiplexer bits and IO circuits.

Figure 4:
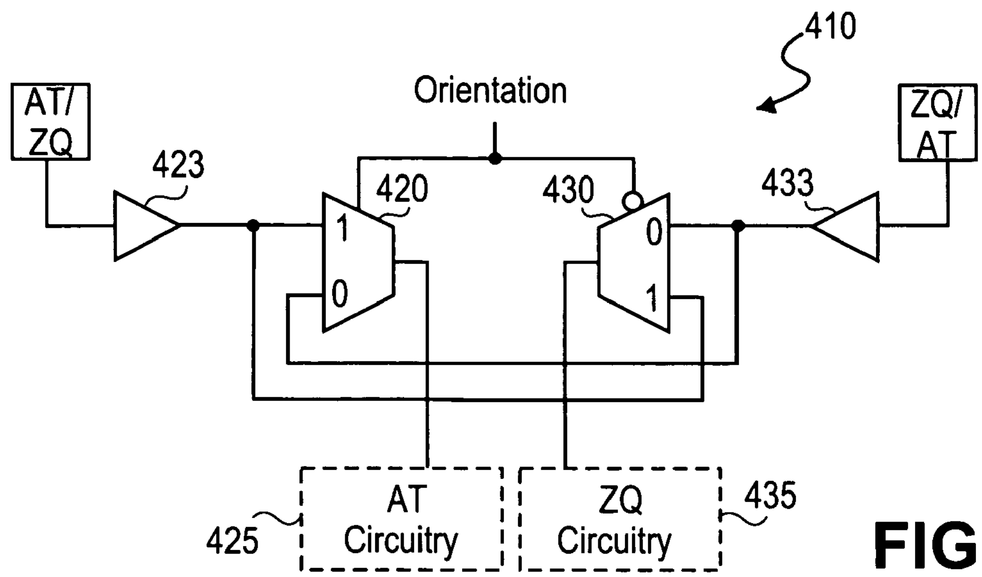
FIG. 4 shows an embodiment of an analog selector circuit in the packaged device.

FIG. 4 shows an embodiment of an analog selector circuit 410 connecting to the pair of asymmetric pins ZQ and Analog Test (AT). The ZQ pin is located in the lower left corner of the package (Q2) in the normal orientation and in the upper right corner (A9) in the rotated orientation (FIG. 1A and FIG. 1B). The AT pin is located in one of the locations (Q2 or A9) not occupied by ZQ. The ZQ pin is typically used for impedance compensation. The ZQ pin may be connected to an external precision resistor. The AT pin is a general purpose analog pin that may be used to observe analog voltages such as band gap reference voltages. Both the ZQ and the AT pins are typically input-only pins. However, it is understood that selector circuit 410 may be easily modified to select pin functionality for output-only or input/output signals.

Selector circuit 410 may include two analog receivers 423, 433 connecting to two cross-coupled internal analog multiplexers 420 and 430. The output of analog multiplexer 420 may be connected to an internal AT circuit 425 receiving analog test signals. The output of analog multiplexer 430 may be connected to an internal ZQ circuit 435 receiving impedance calibration signals. Analog multiplexers 420, 430 may be controlled by the orientation bit received from orientation detector 300 (FIG. 3A) or orientation detector 380 (FIG. 3B). If the orientation bit is "1," analog multiplexer 420 will form a signal conducting path between the input terminal marked "1" (e.g., pin location Q2) and AT circuit 425, and analog multiplexer 430 will form a signal conducting path between the input terminal marked "0" (e.g., pin location A9) and ZQ circuit 435. If the orientation bit is "0," analog multiplexer 420 will form a signal conducting path between the input terminal marked "0" (e.g., pin location A9) and AT circuit 425, and analog multiplexer 430 will form a signal conducting path between the input terminal marked "1" (e.g., pin location Q2) and ZQ circuit 435.

Figure 5:
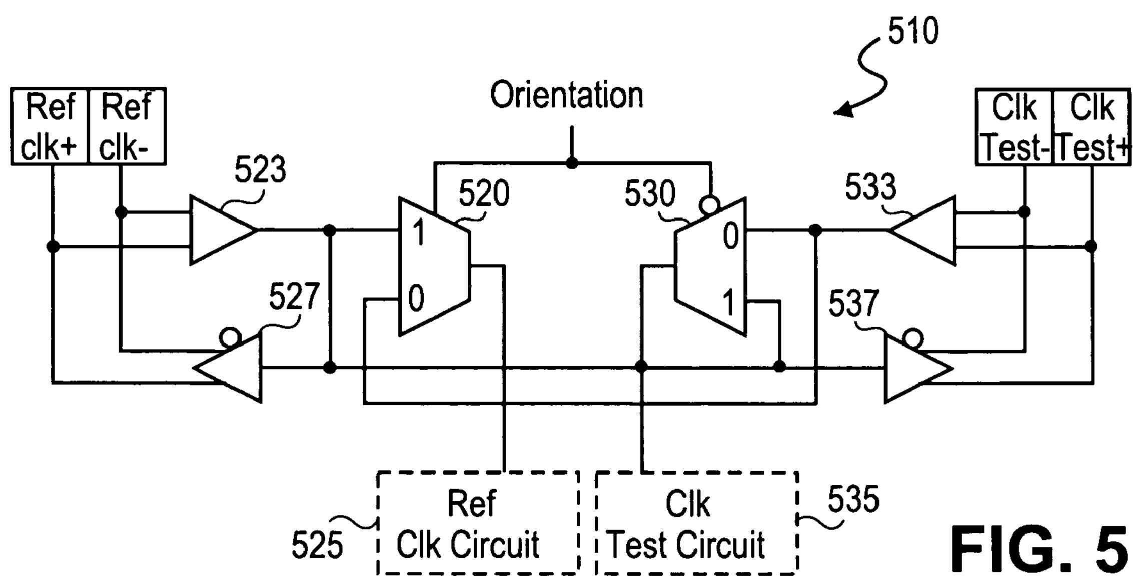
FIG. 5 shows an embodiment of a digital selector circuit in the packaged device.

FIG. 5 shows an embodiment of a digital selector circuit 510 connecting to asymmetric pins reference clocks (Ref Clk+ and Ref Clk−) and clock tests (Clk Test+ and Clk Test−). In a manner similar to the ZQ and AT pins, reference clocks and clock tests share two pins on the left and right sides of the device. The orientation bit defines which pins are to be used for reference clocks and which pins are to be used to clock tests. Clock tests are a pair of differential clock signals for observation or input of internal clocks. The differential clock test pair may be used to read out internal clock signals or, as an input, may be used to override internal clocks. The clock test pair may be useful in debug. For example, if a phase-locked loop (PLL) of the device is non-functional, a high speed external clock may be sent through the clock test pins for use as an alternate clock source.

FIG. 5 is an example of how the Ref Clk+/− and Clk Test+/− pins may be interchanged using the orientation bit. The Ref Clk+/− and Clk Test+/− pins connect to two identical high speed clock receivers 523 and 533. The clock inputs are cross-coupled through two multiplexers 520, 530 which then connect the correct internal clock circuitry 525, 535 according to the orientation bit. Digital selector circuit 510 also includes differential transmitters 527, 537 for transmitting internal clock signals to the pins. As reference clocks are input-only, only the clock test signals may be observed at the output.

Figure 6:
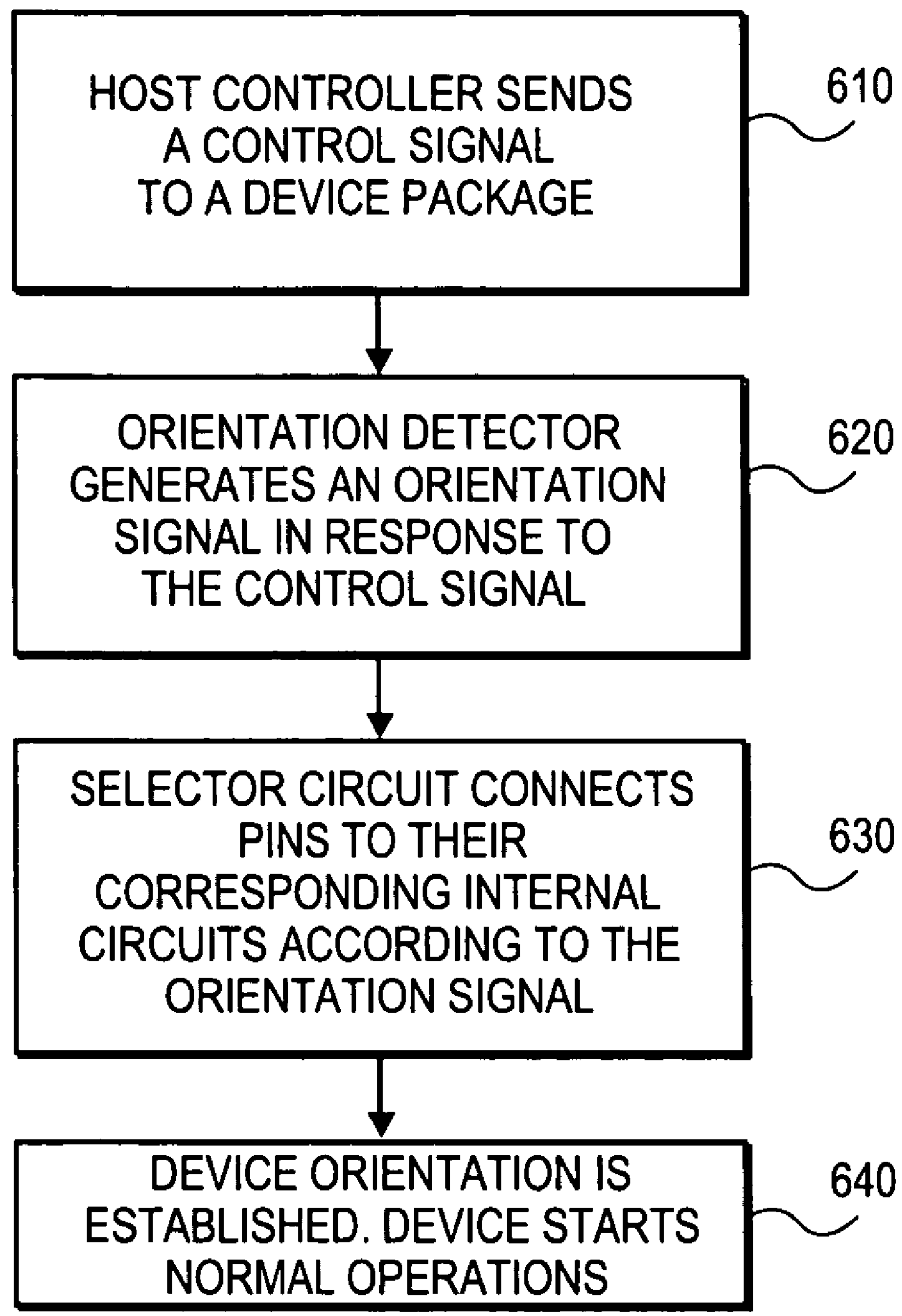
FIG. 6 is a flowchart showing an example of a method for establishing the orientation of the packaged device.

FIG. 6 is a flowchart showing an example of a method for establishing the orientation of a device package. At block 610, a host controller (e.g., host controller 220 of FIG. 2A) sends a control signal to a device package that has a normal or a rotated orientation. The control signal sets the input of a pair of asymmetric pins (e.g., the Sideband pin and the Alert pin) to an appropriate level to indicate the device orientation. The asymmetric pins may be used for active signaling during normal operations. The term "normal operations" refers to operations not dedicated to the configuration of the device package. At block 620, an orientation detector (e.g., orientation detector 300 or 380 in FIG. 3A and FIG. 3B) receives the control signal and generates an orientation signal (e.g., in the form of an orientation bit). For example, host controller 220 may pull the Sideband high and the Alert low to generate a "1" at the output of orientation detector 380. At block 630, a selector circuit (e.g., selector circuit 410 of FIG. 4 or selector circuit 510 of FIG. 5) selects one of two signal paths in each of its multiplexers according to the orientation bit. The selected signal path connects one of two groups of pins on one end of the multiplexer to its corresponding internal circuits on the other end of the multiplexer. A group of pins herein may include merely one pin (e.g., the ZQ pin), a pair of pins (e.g., the differential clock test pair), or more than two pins. At block 640, the device package starts normal operations which may involve all of the pins, including the Sideband and the Alert pins, for active signaling. As the orientation bit holds the same value until a reset signal is applied to the orientation detector, the established device orientation will not be affected by the normal operations of the device.

In the foregoing specification, specific embodiments have been described. It will, however, be evident that various modifications and changes can be made thereto without departing from the broader spirit and scope of the appended claims. The specification and drawings are, accordingly, to be regarded in an illustrative rather than a restrictive sense.

What is claimed is:

1. A method comprising:

inputting a control signal into a pair of asymmetric pins on a device package during a setup phase, the pair of asymmetric pins including a first pin and a second pin that have different functionality, are used for active signaling during normal operations after the setup phase is completed, and exchange respective positions with respect to a reference point on a board or module to which the device package is mounted when an orientation of the device package changes, wherein the control signal received by the first pin is a high level signal and the control signal received by the second pin is a low level signal;

generating an orientation signal within the device package based on the control signal; and using the orientation signal to select the functionality of the first pin and the second pin for the normal operations.

2. The method of claim 1 wherein generating an orientation signal comprises:

establishing the orientation as either normal or rotated 180 degrees.

3. The method of claim 1 wherein generating an orientation signal comprises:

establishing the orientation as either normal or flipped left to right.

4. The method of claim 1 wherein inputting a control signal comprises:

connecting the at least one pin to a host controller that supplies the control signal.

5. The method of claim 1 further comprising:

selecting one of a plurality of pins on the device package to connect to an internal circuit according to at least one orientation bit carried by the orientation signal.

6. The method of claim 1 wherein generating an orientation signal further comprises:

setting a value of the orientation signal during the setup phase; and holding the value of the orientation signal during the normal operations.

7. The method of claim 1 wherein generating an orientation signal further comprises:

setting at least one orientation bit using at least one register within the device package.

8. An apparatus comprising:

a device package including a plurality of pins, the plurality of pins including a pair of asymmetric pins, the pair of asymmetric pins further including a first pin and a second pin that have different functionality, are used for active signaling during normal operations after a setup phase is completed, and exchange respective positions with respect to a reference point on a board or module to which the device package is mounted when an orientation of the device package changes; the device package further including:

an orientation detector to receive, during the setup phase, a control signal from the first pin and the second pin, to generate an orientation signal within the device package based on the control signal, and to use the orientation signal to select the functionality of the first pin and the second pin for the normal operations.

9. The apparatus of claim 8 wherein the orientation detector comprises:

a first register to receive a constant input signal value and generate a first output; and a second register triggered by an assertion of the first output to transfer the control signal to the orientation signal.

10. The apparatus of claim 8 wherein the orientation detector further comprises:

a register triggered by a reset signal to transfer the control signal to the orientation signal.

11. The apparatus of claim 8 wherein the device package further comprises:

a selector circuit connected to a pair of asymmetric pins to select signal paths for the pair according to the orientation signal.

12. The apparatus of claim 11 wherein the selector circuit comprises an analog circuit.

13. The apparatus of claim 11 wherein the selector circuit comprises a digital circuit.

14. The apparatus of claim 8 the orientation detector further comprises:

circuitry to generate the orientation signal during the setup phase and to hold the orientation signal during the normal operations.

15. A system comprising:

a circuit board;

a host controller connected with the circuit board to supply a control signal through the circuit board; and a plurality of memory devices coupled to the host controller through the circuit board, wherein each of the memory devices comprises:

a plurality of pins, the plurality of pins including a pair of asymmetric pins, the pair of asymmetric pins further to include a first pin and a second pin that have different functionality, are used for active signaling during normal operations after a setup phase is completed, and exchange respective positions with respect to a reference point on a board or module to which the memory device is mounted when an orientation of the device package changes; and an orientation detector within the memory device to receive, during the setup phase, the control signal from the first pin and the second pin, to generate an orientation signal within the memory device based on the control signal, and to use the orientation signal to select the functionality of the first pin and the second pin for the normal operations.

16. The system of claim 15 wherein the orientation detector comprises:

a first register to receive a constant input signal value and generate a first output; and a second register triggered by an assertion of the first output to transfer the control signal to the orientation signal.

17. The system of claim 15 wherein the orientation detector further comprises:

at least one register triggered by an on-die or off-die signal to transfer the control signal to the orientation signal.

18. The system of claim 15 wherein the memory device further comprises:

an analog or digital selector circuit connected to a pair of asymmetric pins to select signal paths for the pair according to the orientation signal.

19. The system of claim 15 wherein the orientation detector comprises:

circuitry to generate the orientation signal during the setup phase and to hold the orientation signal during the normal operations.

20. The system of claim 15 wherein the orientation detector comprises:

circuitry to generate a plurality of orientation bits to indicate a plurality of possible device orientations.

21. The system of claim 15 wherein the circuit board comprises:

a backplane for receiving plug-in modules including a controller card on which the host controller is mounted.

22. The system of claim 15 wherein the circuit board comprises:

a motherboard for receiving plug-in modules or directly-mounted devices.

23. The system of claim 15 wherein the memory devices are mounted directly to the circuit board.

24. The system of claim 15 wherein the memory devices are mounted to a dual in-line memory module (DIMM) which is in turn coupled to the circuit board.

25. The system of claim 15 wherein the host controller is located on a same chip as a processing core.

26. The system of claim 15 further comprising:

an input/output (110) controller coupled to the host controller; and a wireless transmitter and receiver coupled to the 110 controller.

* * * * *

UNITED STATES PATENT AND TRADEMARK OFFICE

CERTIFICATE OF CORRECTION

PATENT NO. : 7,644,250 B2
APPLICATION NO. : 11/480137
DATED : January 5, 2010
INVENTOR(S) : Zimmerman et al.

It is certified that error appears in the above-identified patent and that said Letters Patent is hereby corrected as shown below:

In column 10, at line 11 delete, "(110)" and insert --(I/O)--.

In column 10, at line 13 delete, "110" and insert --I/O--.

Signed and Sealed this
Twenty-fifth Day of January, 2011

David J. Kappos
*Director of the United States Patent and Trademark Office*